United States Patent [19]

Kitayoshi

[11] Patent Number: 4,901,027

[45] Date of Patent: Feb. 13, 1990

[54] SIGNAL GENERATOR

[75] Inventor: Hitoshi Kitayoshi, Gyoda, Japan

[73] Assignee: Advantest Corporation, Tokyo, Japan

[21] Appl. No.: 284,691

[22] Filed: Dec. 15, 1988

[30] Foreign Application Priority Data

Dec. 28, 1987 [JP] Japan ................... 62-332599

[51] Int. Cl.$^4$ .............. H03K 5/13; H03K 7/00; H03K 17/00

[52] U.S. Cl. .................. 328/155; 324/83 R; 328/63; 328/72

[58] Field of Search ............... 328/109, 133, 155, 72, 328/63; 324/83 R; 307/511

[56] References Cited

U.S. PATENT DOCUMENTS

| | | | |
|---|---|---|---|
| 4,468,796 | 8/1984 | Suga | 324/83 R |
| 4,680,621 | 7/1987 | Baker et al. | 328/155 |
| 4,700,129 | 10/1987 | Yoshizawa et al. | 324/83 R |
| 4,771,193 | 9/1988 | Ohta | 328/109 |
| 4,835,481 | 5/1989 | Geissler et al. | 328/63 |

Primary Examiner—John S. Heyman
Attorney, Agent, or Firm—Staas & Halsey

[57] ABSTRACT

In a phase accumulation type signal generatorm when an adder of a phase accumulator yields a carry output, a difference circuit generates an analog voltage $V_1=a_2(n-k_s)$ which is in proportion to the difference between the output $k_s$ of the adder and a phase add amount n. A ramp function voltage generator generates a ramp function voltage $V(t)=nfa_1a_3t/cm$ which is in proportion to the product of the frequency f/m of a clock and the phase add amount n. The analog voltage and the ramp function voltage are compared by a comparator, which outputs a synchronization pulse when they agree with each other.

7 Claims, 5 Drawing Sheets

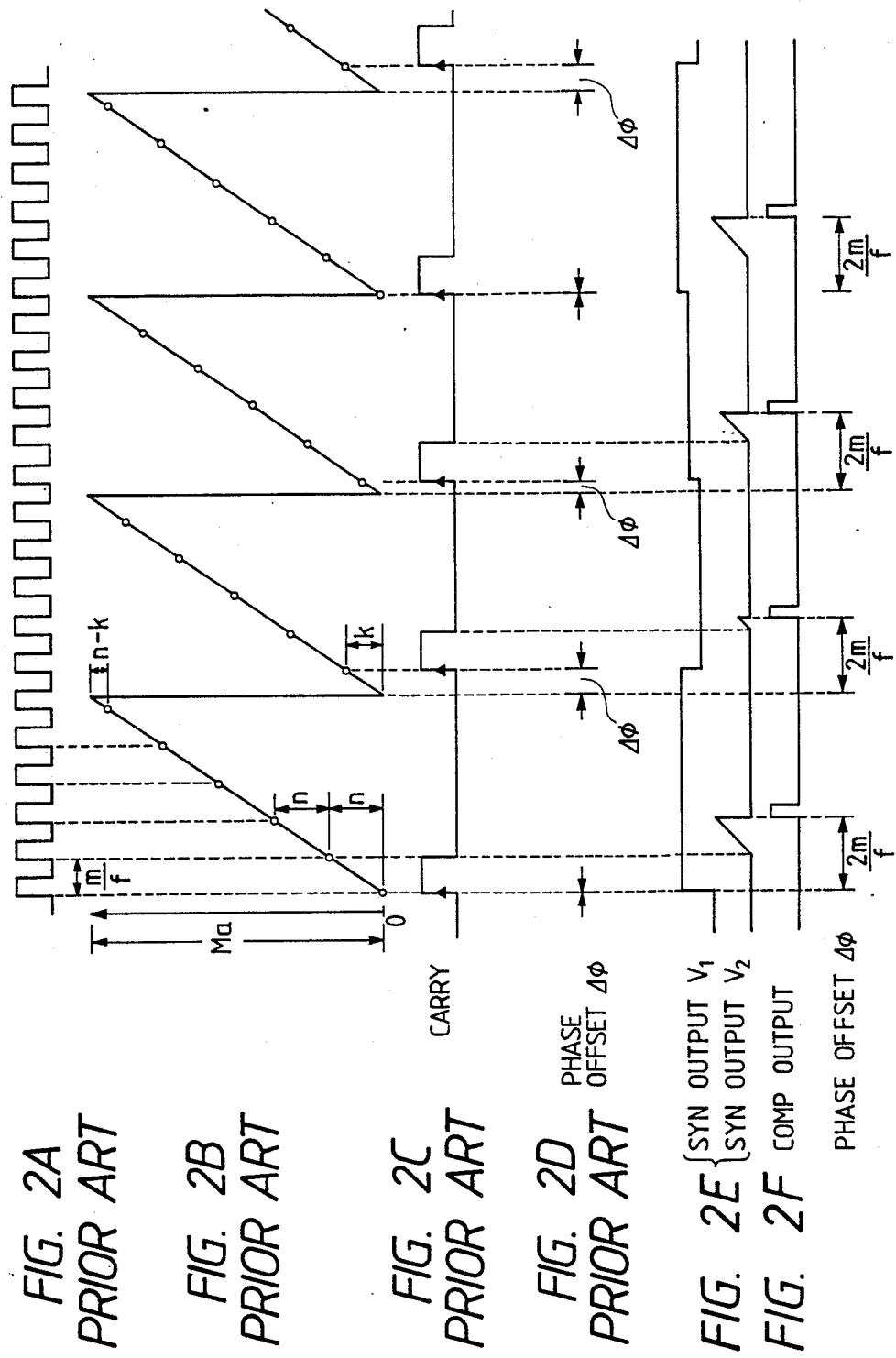

SIGNAL GENERATOR

BACKGROUND OF THE INVENTION

The present invention relates to a phase accumulation type signal generator which accumulates an amount of phase to be added (hereinafter referred to as a phase add amount), for each clock, reads data out of a waveform memory using the added output, and converts the read output into an analog signal.

FIG. 1 is a block diagram of a conventional phase accumulation type signal generator. In a phase accumulator 11 a phase add amount n and the output k of a latch circuit 13 are added by an adder 12 and the added output n+k is latched in the latch circuit 13 for each clock, whereby the phase add amount n is accumulated. A signal of a frequency f, produced by an oscillator 14, is frequency divided by a variable frequency divider 15 down to 1/m to yield a clock, by which the latch circuit 13 is latched.

Data is read out of a waveform memory 16 using the output of the latch circuit 13, and the read output of the waveform memory 16 is latched by the clock in a latch circuit 17. The output of the latch circuit 17 is converted by a D-A converter 18 into an analog signal, which is applied to a low-pass filter 19, an amplifier 21 and an attenuator 22.

The phase accumulation type signal generator in FIG. 1 is capable of generating, with a simple arrangement, low-distortion signals of high frequency accuracy at low and even ultra-low frequencies. However, when the phase add amount n does not bear an integral multiple relationship to the maximum value of the adder 12 (that is, the address space of the memory 16), the amount of offset of the phase (hereinafter referred to as a phase offset amount) at the time a carry is generated, will vary. For example, as shown in FIG. 2A, the phase add amount n is accumulated for each clock, the output of the adder 12 increases as shown in FIG. 2B, and upon generation of the clock immediately after an overflow of the adder 12, a carry is yielded as a synchronization pulse as depicted in FIG. 2C. The phase offset amount $\Delta\phi$ of this synchronization pulse fluctuates as shown in FIG. 2D, and consequently, such a synchronization pulse cannot be employed for triggering a synchronous detection or Fourier transformation for impedance measurement.

Impedance measurement calls for a sine-wave signal which is applied to a measuring object and a pulse signal which is accurately synchronized with the sine-wave signal. FIG. 3 shows a conventional method used to meet this requirement. The output of an oscillator 31 is frequency divided by a frequency divider 32, the output of which is filtered by a low-pass filter 33 to produce a sine-wave signal. The sine-wave signal is applied to a measuring object 34, the current output of which is converted by a current-voltage converter 35 into a voltage signal. The voltage signal is provided to a synchronous detector 36, wherein it is synchronously detected by the output of the frequency divider 32, and the synchronously detected output is integrated by an integrator 37.

In this instance, since the filter characteristic of the low-pass filter 33 is fixed, the number of frequencies used is limited to one or several and the frequency used cannot be changed.

SUMMARY OF THE INVENTION

It is therefore an object of the present invention to provide a phase accumulation type signal generator with which it is possible to obtain a synchronization pulse accurately synchronized with a waveform which is provided from a waveform memory.

According to the phase accumulation type signal generator of the present invention, when a carry output is yielded from the adder of the phase accumulator, an analog voltage is generated which is in proportion to the difference between the adder output $k_s$ and the phase add amount n, and a ramp function voltage $V(t) = nfa_1a_3t/(cm)$ is produced which is in proportion to the product of the clock frequency f/m and the phase add amount n. The analog voltage and the ramp function voltage are compared by a comparator, which yields a synchronization pulse when they agree with each other.

That is, the synchronization pulse is generated at $t = a_2(n - k_s)cm/(nfa_1a_3)$. If it is predetermined that $a_2c/(a_1a_3) = 1$, then the synchronization pulse is always fixed to a phase offset $2m/f$ (sec).

BRIEF DESCRIPTION OF THE DRAWINGS

FIGS. 2A, 2B, 2C and 2D show waveforms for explaining the operation of the conventional signal generator;

FIGS. 2E and 2F are waveforms for explaining the operation of the present invention;

DESCRIPTION OF THE PREFERRED EMBODIMENTS

Figure 1:
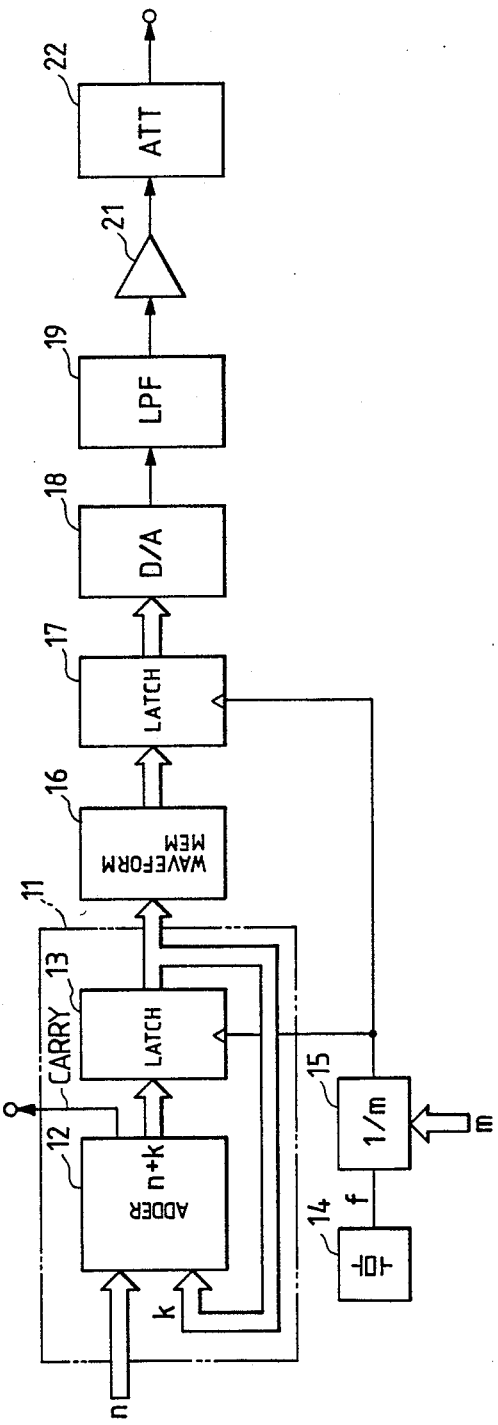
FIG. 1 is a block diagram of a conventional signal generator.
Figure 3:
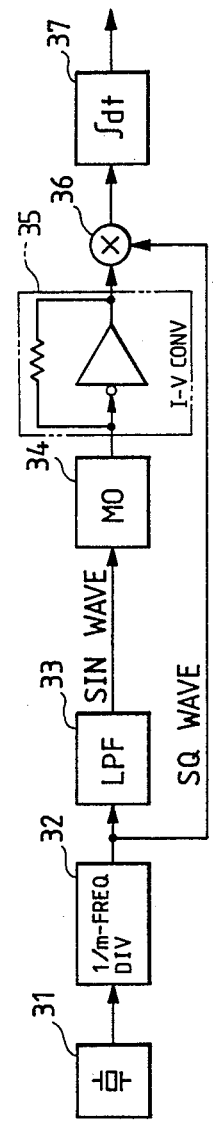
FIG. 3 is a block diagram of a conventional impedance measuring apparatus.
Figure 4:
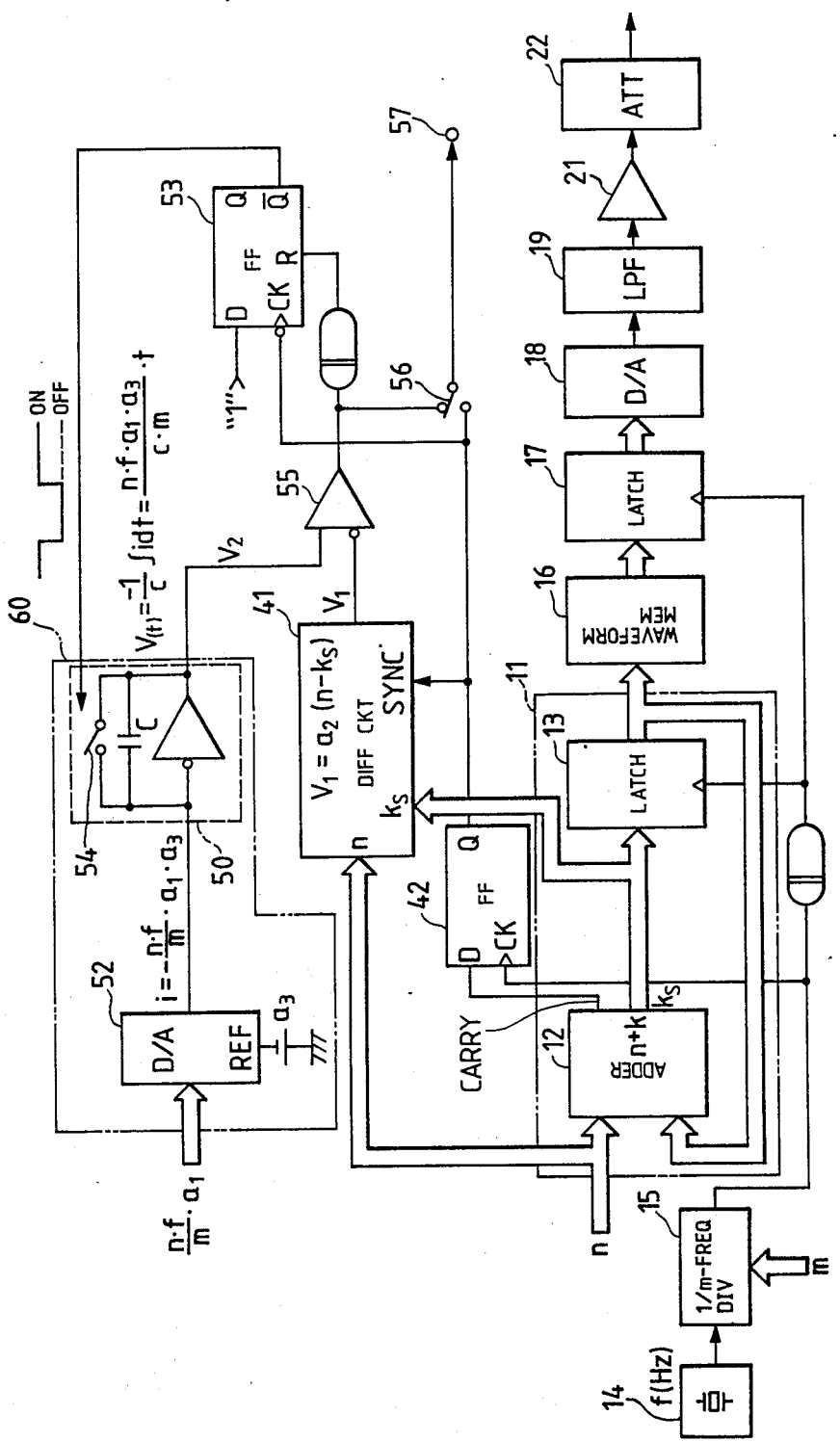
FIG. 4 is a block diagram of an embodiment of the signal generator of the present invention.

FIG. 4 illustrates in block form an embodiment of the present invention, in which the parts corresponding to those in FIG. 1 are identified by the same reference numerals. According to the present invention, when a carry output is yielded from the adder 12, a difference circuit 41 generates an analog voltage $V_1 = a_2(n - k_s)$ which is in proportion to the difference between the output $k_s$ of the adder 12 and the phase add amount n. The carry output from the adder 12 is loaded into a D-type flip-flop 42 by the clock from the frequency divider 15. The output of the D-type flip-flop 42 is applied to an input Sync of the difference circuit 41. The difference circuit 41 is supplied with the phase add amount n and the output $k_s$ of the adder 12.

Figure 5:
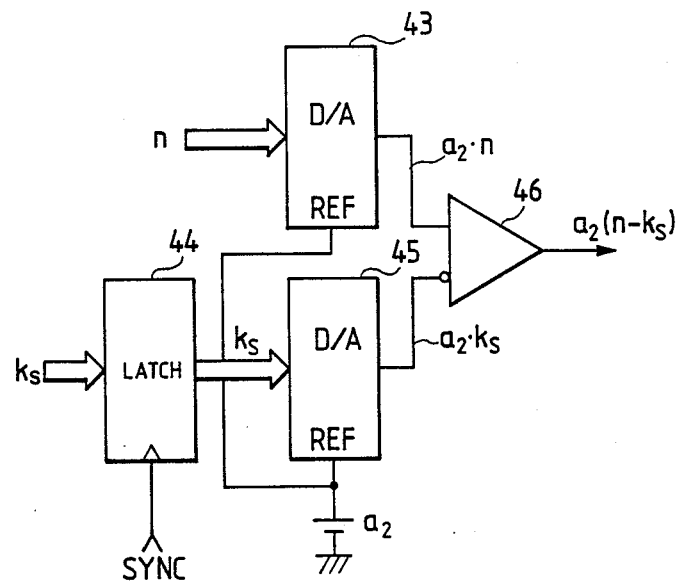
FIG. 5 is a block diagram of a specific operative example of a difference circuit 41 used in FIG. 4.

FIG. 5 shows a specific operative example of the difference circuit 41, in which the input phase add amount n thereto is converted by a D-A converter 43 into an analog voltage $a_2n$, the output $k_s$ of the adder 12 is latched by the Sync input in a latch circuit 44, and the output $k_s$ of the latch circuit 44 is converted by a D-A converter 45 into an analog voltage $a_2k_s$, which is subtracted from the analog voltage $a_2n$ in an analog subtractor 46, providing $a_2(n - k_s)$.

Figure 6:
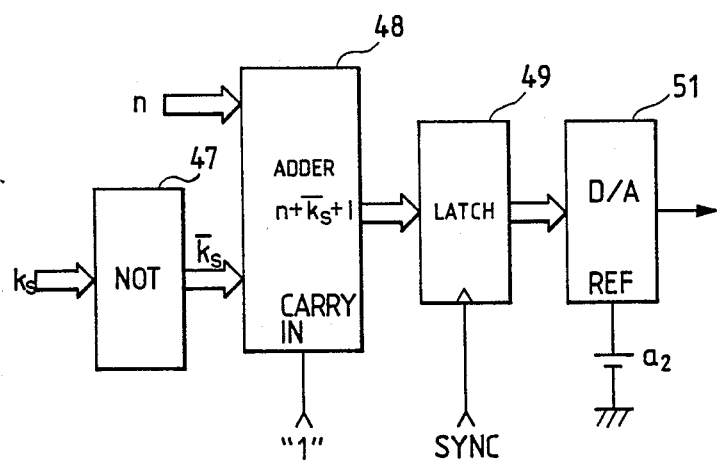
FIG. 6 is a block diagram of another example of the difference circuit 41.

FIG. 6 shows another example of the difference circuit 41, in which the output $k_s$ of the adder 12 is reversed in sign by a NOT circuit 47 to obtain a complement $\bar{k}_s$ which is provided to an adder 48, wherein it is added with the phase add amount n and 1 to obtain $n+\bar{k}_s+1$. The added output is latched in a latch circuit 49 by the Sync input. The latch output is converted by a multiplier type D-A converter 51 into the analog voltage $a_2(n-k_s)$.

In FIG. 4, a ramp function voltage $V(t)=nfa_1a_3t/cm$ is produced which is in proportion to the product of the clock frequency f/m and the phase add amount n. Consequently, a value $nfa_1/m$ which is in proportion to the product of the clock frequency f/m and the phase add amount n is converted by a D-A converter 52 into an analog current $i=-nfa_1a_3/m$. This analog current is integrated by an integrator 50. An inverted signal of the output of the D-type flip-flop 42 is applied to a D-type flip-flop 53 to load therein a high-level signal "1", and a low-level signal from the $\overline{Q}$ output of the D-type flip-flop 53 is applied to a reset switch 54 of the integrator 50, turning it OFF. Consequently, when the synchronization pulse, i.e. the carry shown in FIG. 2C, falls, the $\overline{Q}$ output of the flip-flop 53 goes to a "0", by which the reset switch 54 is turned OFF, and the integrator 50 starts integration as shown in FIG. 2E, yielding a ramp function voltage as follows:

$$V(t) = \frac{-1}{c} \int i dt = \frac{nfa_1a_3}{cm} t.$$

The D-A converter 52 and the integrator 50 constitute a ramp function voltage generator 60. The ramp function voltage V(t) and the analog voltage $V_1$ from the difference circuit 41 are compared by a comparator 55, which yields a high-level signal "1" when the ramp function voltage V(t) exceeds the analog voltage $V_1$. The output of the comparator 55 is applied via a changeover switch 56 to an output terminal 57, and at the same time, it is applied to a reset terminal R of the D-type flip-flop 53. When the output of the comparator 55 goes high-level, the flip-flop 53 is reset and its $\overline{Q}$ output also goes high-level, by which the reset switch 54 is turned ON, resetting the integrator 50. As a result of this, the output of the comparator 55 becomes as shown in FIG. 2F.

Based on time resolution m/f of the phase accumulation clock, the phase add amount n and the output $k_s$ of the adder 12 at the time of generation of its carry output, the phase offset time becomes $(n-k_s)f/nm$ seconds. The comparator 55 yields a pulse at a time point $t=a_2(n-k_s)cm/nfa_1a_3$ when the ramp function voltage V(t) becomes equal to the analog voltage $V_1$. In this instance, if it is determined that $a_2c/a_1a_3=1$, then the output pulse from the comparator 55 will become a synchronization pulse offset $\Delta\phi$ by a 2m/f (sec) phase, that is, a fixed-phase-offset synchronization pulse. The synchronization pulse from the comparator 55 and the synchronization pulse from the flip-flop 42 can selectively be provided via the switch 56 as required.

Figure 7:
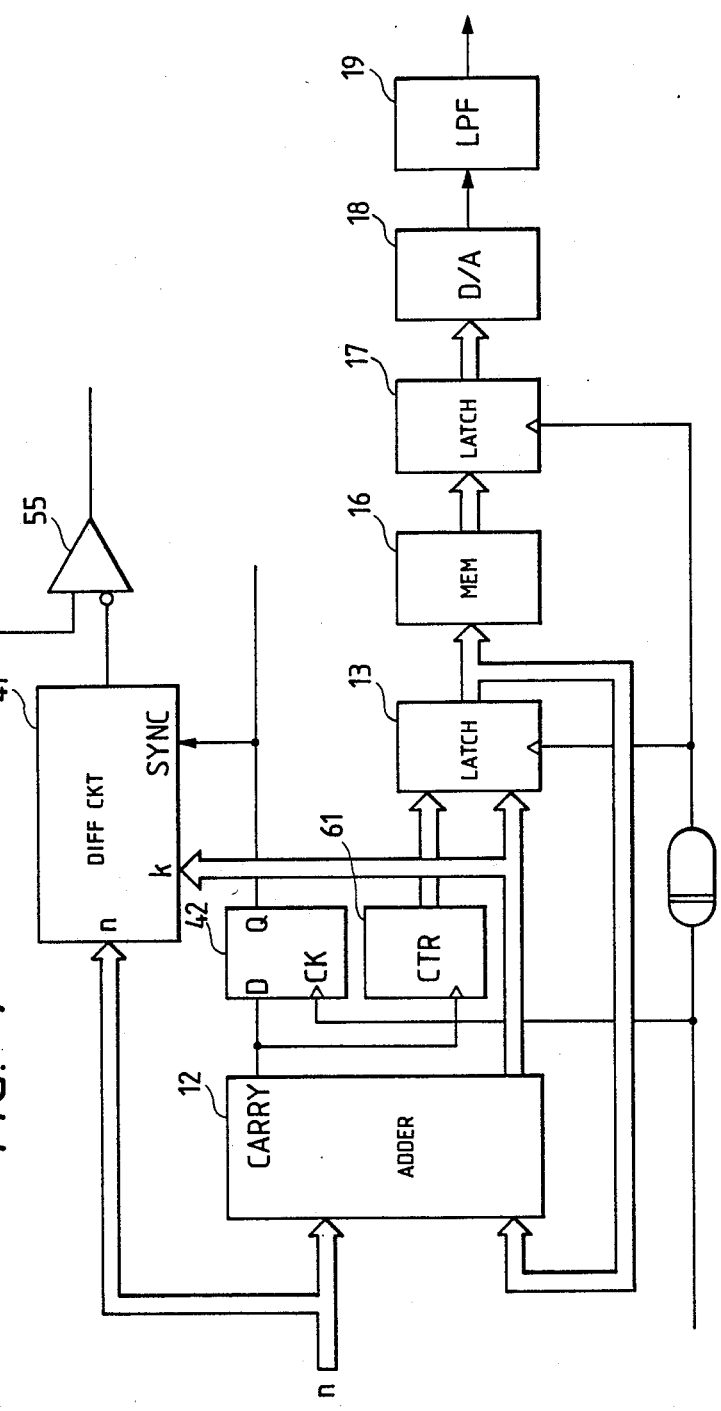
FIG. 7 is a block diagram of a modified form of the signal generator of the present invention.

It is also possible to generate two or more synchronization pulses at regular time intervals every cycle of the waveform which is read out of the waveform memory 16. FIG. 7 illustrates a part of the circuit arrangement therefor, in which the parts corresponding to those in FIG. 4 are indicated by the same reference numerals. The carry output of the adder 12 is counted by a counter 61, the content of which is latched as a high-order bit in the latch circuit 13. The contents of the counter 13 latched in the latch circuit 13 and the adder 12 are used to read data from the waveform memory 16. When the counter 61 is a 1-bit counter, two synchronization pulses are yielded from the comparator 55 at regular time intervals during one cycle of the waveform which is read out of the waveform memory 16. When the counter 61 is a 2-bit counter, the comparator 55 generates four synchronization pulses at regular time intervals during one cycle of the waveform which is read out of the waveform memory 16.

As described above, according to the present invention, a synchronization pulse of a fixed phase offset amount $\Delta\phi$ can be obtained even if the phase add amount n does not bear an integral multiple relationship to the address space of the waveform memory 16. It is therefore possible, for example, in an impedance measuring apparatus, to supply a measuring object with a sine-wave signal obtained from the waveform memory 16 and synchronously detect the output of the measuring object by a synchronization pulse. In addition, the frequency of the waveform signal can easily be changed by changing the phase add amount n or the frequency dividing ratio m of the frequency divider 15. For instance, signals of frequencies 10 Hz to 1 MHz can be generated with a resolution of 1 mHz.

It will be apparent that many modifications and variations may be effected without departing from the scope of the novel concepts of the present invention.

What is claimed is:

1. A signal generator comprising:
   a phase accumulator for accumulating a phase add amount n upon each occurrence of a clock of a frequency f/m and for providing an output;
   a waveform memory, coupled to said phase accumulator, which is read out based on the output of said phase accumulator;
   a first digital-to-analog (D-A) converter, coupled to said waveform memory, for converting the output of said waveform memory into an analog signal;
   a difference circuit, coupled to said phase accumulator, which, when said phase accumulator yields a carry output, generates an analog voltage $V_1=a_2(n-k_s)$ which is in proportion to the difference between the output $k_s$ of the phase accumulator and the phase add amount n;
   a ramp function voltage generator for generating a ramp voltage $V(t)=nfa_1a_3t/cm$ which is in proportion to the product of the clock frequency f/m and the phase add amount n; and
   a comparator, coupled to said ramp function voltage generator and said difference circuit, which compares the analog voltage and the ramp function voltage and outputs a synchronization pulse when they agree with each other.

2. The signal generator of claim 1, wherein said difference circuit comprises:
   a second D-A converter for converting the phase add amount n into an analog signal;
   a third D-A converter for converting the output $k_s$ of said phase accumulator into an analog signal; and
   an analog subtractor, coupled to said second and third D-A converters, for subtracting the output of said third D-A converter from the output of said second D-A converter.

3. The signal generator of claim 1, wherein said difference circuit comprises:

a NOT circuit, coupled to said phase accumulator, for inverting the sign of the output $k_s$ of said phase accumulator to obtain a complement $\bar{k}_s$;

a digital adder, coupled to said NOT circuit, for adding the complement $\bar{k}_s$, the phase add amount n and a numerical value; and a second D-A converter, coupled to said digital adder, for converting the output of said digital adder into an analog signal.

4. The signal generator of claim 1, wherein said ramp function voltage generator comprises:

a second D-A converter for converting $nfa_1/m$ into an analog signal; and an integrator for integrating the output of said second D-A converter.

5. The signal generator of claim 4, further comprising a D-type flip-flop coupled to said comparator, said phase accumulator, and said integrator, wherein said integrator has a reset switch and wherein said D-type flip-flop is cleared by the output of said comparator, loads a logic "1" by the carry output of said phase accumulator and controls, by its $\bar{Q}$ output, the reset switch of said integrator.

6. The signal generator of claim 1, wherein said phase accumulator includes an adder, further comprising a counter for counting the carry output of said adder of said phase accumulator, wherein said waveform memory is read out using the output of said counter as a high-order bit and the output of said adder as a low-order bit.

7. A phase accumulation type signal generator for receiving a phase add amount and a clock, comprising:

a phase accumulator for accumulating the phase add amount upon each occurrence of the clock and for providing an added output and a carry output;

a waveform memory, coupled to said phase accumulator, for reading out data based on the added output of said phase accumulator;

a difference circuit, coupled to said phase accumulator, for generating an analog voltage proportional to the difference between the added output of said phase accumulator and the phase add amount when said phase accumulator yields the carry output;

a ramp function voltage generator for generating a ramp voltage which is in proportion to the product of the clock frequency and the phase add amount; and a comparator, coupled to said ramp function voltage generator and said difference circuit, for comparing the ramp voltage and the analog voltage, and for generating a synchronization pulse when the analog voltage and the ramp function voltage are substantially equal to each other.

* * * * *